(12) United States Patent
Kanbe

(10) Patent No.: US 7,579,207 B2
(45) Date of Patent: Aug. 25, 2009

(54) SOLID-STATE IMAGING DEVICE, METHOD OF PRODUCING THE SAME AND CAMERA

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 417 days.

(21) Appl. No.: 11/602,891

(22) Filed: Nov. 20, 2006

(65) Prior Publication Data

US 2007/0086763 A1 Apr. 19, 2007

Related U.S. Application Data

(63) Continuation of application No. 11/217,777, filed on Sep. 1, 2005, now Pat. No. 7,233,049.

(30) Foreign Application Priority Data

Sep. 16, 2004 (JP) ............................. 2004-269907

(51) Int. Cl.
*H01L 21/00* (2006.01)
(52) U.S. Cl. ............................. 438/57; 438/60; 438/75; 438/144; 257/E21.617
(58) Field of Classification Search .................. 438/57, 438/60, 75, 144; 257/E21.185, E21.189, 257/E21.456, E21.617
See application file for complete search history.

(56) References Cited

U.S. PATENT DOCUMENTS 5,235,426 A * 8/1993 Shibusawa .................. 348/311
5,895,944 A * 4/1999 Yamada ...................... 257/233
6,160,580 A * 12/2000 Nakashiba .................. 348/320
6,335,220 B1 1/2002 Shioyama et al.
6,580,105 B1 6/2003 Hatano et al.

FOREIGN PATENT DOCUMENTS

JP 09-036349 2/1997

* cited by examiner

*Primary Examiner*—Charles D. Garber
*Assistant Examiner*—Stanetta D Isaac
(74) *Attorney, Agent, or Firm*—Robert J. Depke; Rockey, Depke & Lyons, LLC.

(57) ABSTRACT

The prevent invention is to provide a solid-state imaging device having a electrode configuration applicable to a progressive scan, and able to reduce a obstruction of incident light at the periphery of a light receiving portion, a method of producing the same, a camera including the same. A first transfer electrode, a second transfer electrode, and a third transfer electrode which have a single layer transfer electrode configuration are repeatedly arranged in a vertical direction. The first transfer electrodes are connected in a horizontal direction by an inter-pixel interconnection formed in the same layer. Shunt interconnections are formed in the horizontal direction and in the vertical direction above the transfer layers. The shunt interconnection connected to the second transfer interconnection is formed on the inter-pixel interconnection. The shunt interconnection connected to the third transfer electrode is formed above the transfer electrodes.

9 Claims, 7 Drawing Sheets

SOLID-STATE IMAGING DEVICE, METHOD OF PRODUCING THE SAME AND CAMERA

The subject matter of application Ser. No. 11/217,777 is incorporated herein by reference. The present application is a continuation of U. S. application Ser. No. 11/217,777, filed Sep. 1, 2005 now U.S. Pat. No. 7,233,049, which claims priority to Japanese Patent Application No. JP2004-269907, filed Sep. 16, 2004. The present application claims priority to these previously filed applications.

CROSS REFERENCES TO RELATED APPLICATIONS

The present invention contains subject matter related to Japanese Patent Application No. JP 2004-269907 filed in the Japanese Patent Office on Sep. 16, 2004, the entire contents of which being incorporated herein by reference.

BACKGROUND OF THE INVENTION

1. Field of the Invention

The present invention relates to, particularly, a charge coupled device (CCD) type solid-state imaging device, a method of producing the same, and a camera including the same.

2. Description of the Related Art

There is known, as a digital still camera imaging device, a CCD solid-state imaging device has been used well, mostly, it is an interline transfer type (so-called as an "IT type") CCD. Among them, there are a field integration, a frame integration and a progressive scan.

In the field integration or the frame integration, by dividing the whole pixel information into two times or more and reading out it, there is a merit, for example, that a restriction of a vertical transfer unit (vertical CCD) due to a dynamic range can be avoided. However, due to a read out operation divided into a plurality of times, there is a demerit, for example, of an outflow of a signal charge caused by heat and a difference of a dark current between fields.

In the progressive scan, since the whole pixels can be read out simultaneously, there is a merit, for example, that an accurate optical shatter (mostly, a mechanical shatter) is unnecessary. However, a transfer electrode is configured by a three- or more layers-stacked poly silicon electrode, so that a processing thereof is complicated and a step thereof is increased. Further, an unevenness in the vertical transfer unit becomes obviously, so an eclipse of incident light (namely, light to be incidence to a light receiving portion is blocked off by a shield film) easily occurs due to such unevenness. Therefore, a sensitivity shading and a sensitivity deterioration at a lens opening side may be easily caused.

As the solid-state imaging device for the progressive scan, Japanese Patent No. 2,878,546 discloses a solid-state imaging device in which a transfer electrode with a single layer electrode structure is used and a driving pulse is supplied from a metal interconnection which is an upper layer of the transfer electrode to a separated transfer electrode in the transfer electrode.

SUMMARY OF THE INVENTION

However, in the above document, the metal interconnection is also used as the shield film and formed to cover approximately entire surface of the transfer electrode, so that there has been a large step difference between the light receiving portion and the transfer electrode. As a result, the eclipse of the incidence light described above is not able be reduced.

The present invention is to provide a solid-state imaging device having an electrode configuration applicable to the progressive scan and able to reduce an obstruction of the incidence light at the periphery of the light receiving portion, and a method of producing the same and a camera including the same.

According to an embodiment of the present invention, there is provided a solid-state imaging device including a plurality of light receiving portions arranged in a first direction and in a second direction perpendicular to the first direction; a plurality of transfer channels placed between the respective light receiving portions and extending in the second direction; a first transfer electrode, a second transfer electrode, and a third transfer electrode placed repeatedly in the same plane on the respective transfer channels; an inter-pixel interconnection placed in the same plane as the first transfer electrode and connected to a plurality of the first transfer electrodes arranged in the first direction; an second transfer electrode drive interconnection extending in the first direction above the first transfer electrode and the inter-pixel interconnection and respectively connected to a plurality of the second transfer electrodes arranged in the first direction; and a third transfer electrode drive interconnection extending in the second direction above the first, second, and third transfer electrodes and respectively connected to the third transfer electrode arranged in the second direction.

According to an embodiment of the present invention, there is provided a method of producing a solid-state imaging device having the steps of: injecting impurities to a substrate to form a plurality of light receiving portions and a plurality of transfer channels, the light receiving portion being arranged in a first direction and in a second direction perpendicular to the first direction, and the transfer channel being placed between the respective light receiving portions and extending in the second direction; depositing a conductive layer on the substrate; processing the conductive layer to form a first transfer electrode, a second transfer electrode, and a third transfer electrode which are repeatedly placed in the same plane on the respective transfer channels and to form an inter-pixel interconnection which connects the plurality of the first electrode arranged in the first direction; forming a second transfer electrode drive interconnection above the first transfer electrode and the inter-pixel interconnection, the second transfer drive interconnection being connected to the plurality of the second transfer electrodes arranged in the first direction; and forming a third transfer electrode drive interconnection above the first, second, and third transfer electrodes, the third transfer drive interconnection being connected to the plurality of the third transfer electrodes arranged in the second direction.

According to an embodiment of the present invention, there is provided a camera having: a solid-state imaging device; an optical system making light focus on an imaging surface of the solid-state imaging device; and a signal processing circuit performing a predetermined signal processing to an output signal from the solid-state imaging device. The solid-state imaging signal includes: a plurality of light receiving portions arranged in a first direction and in a second direction perpendicular to the first direction; a plurality of transfer channels placed between the respective light receiving portions and extending in the second direction; a first transfer electrode, a second transfer electrode, and a third transfer electrode placed repeatedly in the same plane on the respective transfer channels; an inter-pixel interconnection placed in the same plane as the first transfer electrode and connected to a plurality of the first transfer electrodes arranged in the first direction; an second transfer electrode drive interconnection extending in the first direction above the first transfer electrode and the inter-pixel interconnection and respectively connected to a plurality of the second transfer electrodes arranged in the first direction; and a third transfer electrode drive interconnection extending in the second direction above the first, second and third transfer electrodes and respectively connected to the third transfer electrode arranged in the second direction.

According to an embodiment of the present invention, it can be realized a solid-state imaging device having an electrode configuration applicable to the progressive scan and able to reduce an obstruction of the incidence light at the periphery of the light receiving portion, a method of producing the same, and a camera including the same.

BRIEF DESCRIPTION OF THE DRAWINGS

These features of embodiments of the present invention will be described in more detail with reference to the accompanying drawings, in which.

DESCRIPTION OF THE PREFERRED EMBODIMENTS

Preferred embodiments of the present invention will be described with reference to the accompanying drawings.

Figure 1:
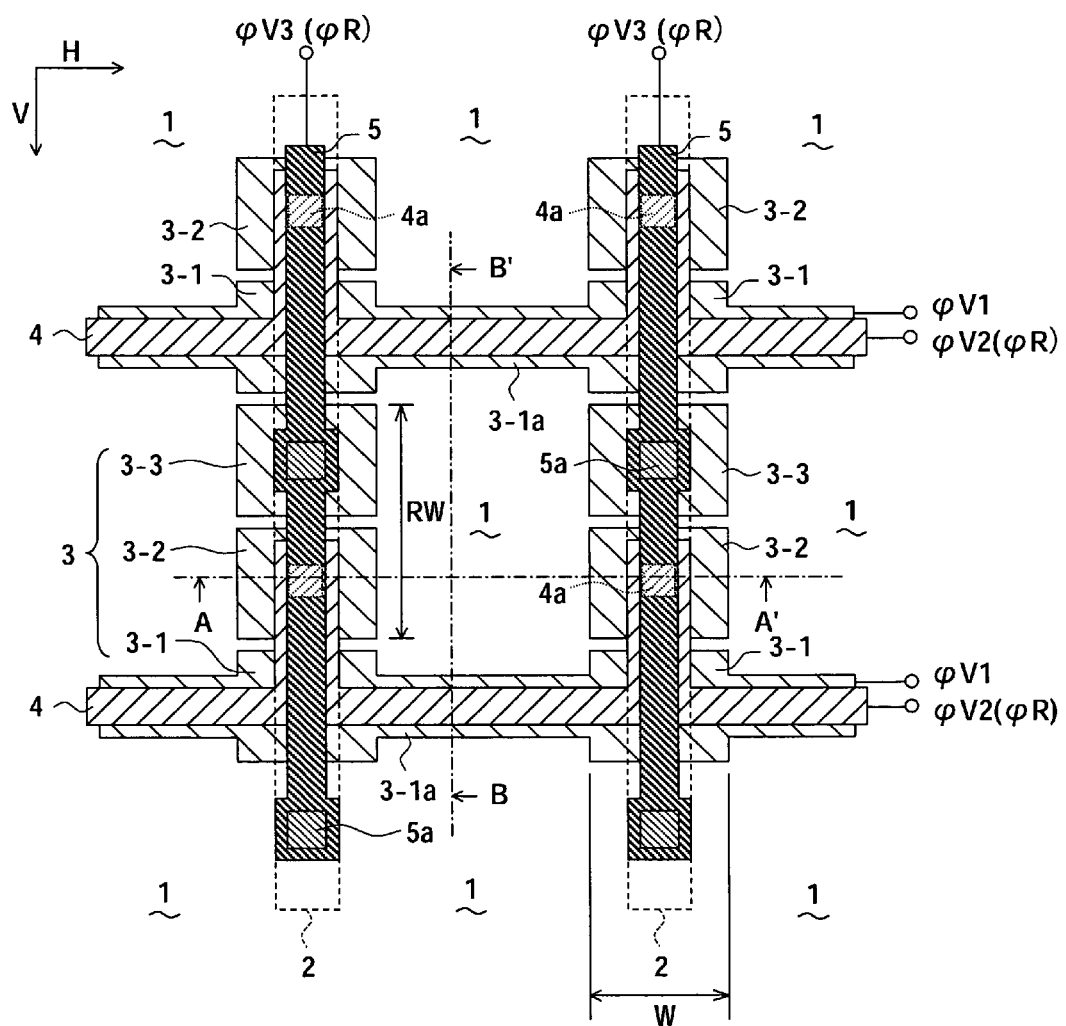
FIG. 1 is a plan view of a pixel unit of a solid-state imaging device according to the present embodiment.

FIG. 1 is a plan view of an elementally portion of a pixel unit in a solid-state imaging device according to the present embodiment. In the present embodiment, the solid-state imaging device applicable to the progressive scan and having three phases drive will be described.

Light receiving portions 1 included in a pixel are arranged in the pixel unit. A plurality of the light receiving portions 1 is arranged in a horizontal direction and in a vertical direction. The light receiving portion 1 is made from a photo diode, generates a signal charge corresponding to an amount of incidence light, and stores the signal charge for a specified duration.

A transfer channel 2 is placed between two light receiving portions 1 arranged in the horizontal direction H to expand in the vertical direction V. The transfer channel 2 generates a potential distribution for transferring the signal charge in the vertical direction V.

Three types of transfer electrodes 3 respectively supplying transfer pulses with different phases ΦV1, ΦV2, and ΦV3 are arranged on the transfer channel 2 expanding the vertical direction V. The transfer electrodes 3 are divided into a first transfer electrode 3-1 to which the transfer pulse ΦV1 is supplied, a second transfer electrode 3-2 to which the transfer pulse ΦV2 is supplied, and a third transfer electrode 3-3 to which the transfer pulse ΦV3 is supplied. Note that, particularly if it is unnecessary to discriminate the first transfer electrode 3-1, the second transfer electrode 3-2, and the third transfer electrode 3-3, it may be simply referred to the transfer electrode 3.

In the present embodiment, a single layer transfer electrode structure including the first transfer electrode 3-1, the second transfer electrode 3-2, and the third transfer electrode 3-3 in the same plane is employed. The transfer electrode 3 is made of, for example, polysilicon.

The third transfer electrode 3-3, the second transfer electrode 3-2, and the first transfer electrode 3-1 are repeatedly arranged in the vertical direction V. By the transfer electrode 3 and the transfer channel 2 described above, so-called a vertical transfer unit (vertical CCD) which is commonly placed in each of columns of the light receiving portion 1 arranged in the vertical direction V is formed.

A plurality of the first transfer electrodes 3-1 arranged in the horizontal direction H is connected by an inter-pixel interconnection 3-1a. The inter-pixel interconnection 3-1a extends in the horizontal direction H at an interval of the light receiving portion 1 arranged in the vertical direction V, and is formed in the same plane as the transfer electrode 3-1. Namely, the inter-pixel interconnection 3-1a is made of polysilicon integrally formed with the first transfer electrode 3-1.

The second transfer electrode 3-2 is separated on the transfer channel 2, namely, is a separated shape without a connection in the horizontal direction H. The second transfer electrode 3-2 is arranged to adjoin the light receiving portion 1.

The third transfer electrode 3-3 is separated on the transfer channel 2, namely, is a separated shape without a connection in the horizontal direction H. The third transfer electrode 3-3 is arranged to adjoin the light receiving portion 1.

A shunt interconnection (a second transfer electrode drive interconnection) 4 extending in the horizontal direction H is placed on the first transfer electrode 3-1 and the inter-pixel interconnection 3-1a via an insulation film. The shunt interconnection 4 also extends in the vertical direction V on the respective first transfer electrodes 3-1, and is connected to the second transfer electrode 3-2 at a contact portion 4a. A single shunt interconnection 4 is connected to a plurality of the second transfer electrodes 3-2 arranged in the horizontal direction H. A width of the shunt interconnection 4 is narrower than that of the inter-pixel interconnection 3-1a.

The shunt interconnection 4 is made of polysilicon, tungsten, or other metal material. When using metal material as the shunt interconnection 4, if the thickness or the width is made smaller than when using polysilicon, the similarly level of resistance can be obtained, so that there is an advantage that the step difference which occurs at the periphery of the light receiving portion 1 can be made smaller.

A shunt interconnection (a third transfer electrode drive interconnection) 5 extending via an insulation film in the vertical direction V is placed as an upper layer than the shunt interconnection 4 and above the transfer electrode 3 arranged in the vertical direction V. The shunt interconnection 5 is connected to the third transfer electrode 3-3 at a contact portion 5a. A single shunt interconnection 5 is connected to a plurality of the third transfer electrodes 3-3 arranged in the vertical direction V. A width of the shunt interconnection 5 is narrower than the transfer electrode 3.

The shunt interconnection 5 is made of polysilicon, tungsten, or other metal material. An advantage by using metal material as the shunt interconnection 5 is similar to the shunt interconnection 4.

In the solid-state imaging device described above, three transfer electrodes 3-1, 3-2, and 3-3 are placed for a single light receiving portion 1. Since three transfer electrodes 3-1, 3-2, and 3-3 are placed for a single light receiving portion 1, it is applicable to the progressive scan.

The present embodiment will describe an example of the three-phase drive solid-state imaging device. The transfer pulse ΦV1 is supplied through the inter-pixel interconnection 3-1a to the entire first transfer electrodes 3-1 arranged in the horizontal direction. The transfer pulse ΦV2 is supplied through the shunt interconnection 4 to the entire second transfer electrodes 3-2 arranged in the horizontal direction. The transfer pulse ΦV3 is supplied through the shunt interconnection 5 to the entire third transfer electrodes 3-3 arranged in the vertical direction. The transfer pulses ΦV1, ΦV2, and ΦV3 are −7 to 0 V, for example.

A read-out pulse ΦR for transferring a signal charge stored in the light receiving portion 1 to the transfer channel 2 are supplied through the shunt interconnections 4 and 5 to the second transfer electrode 3-2 and the third transfer electrode 3-3 respectively separated to adjoin the light receiving portion 1. The read-out pulse ΦR, for example, is +12 to +15 V. Note that, the read-out pulse ΦR may be supplied to either the second transfer electrode 3-2 or the third transfer electrode 3-3.

Figure 2A:
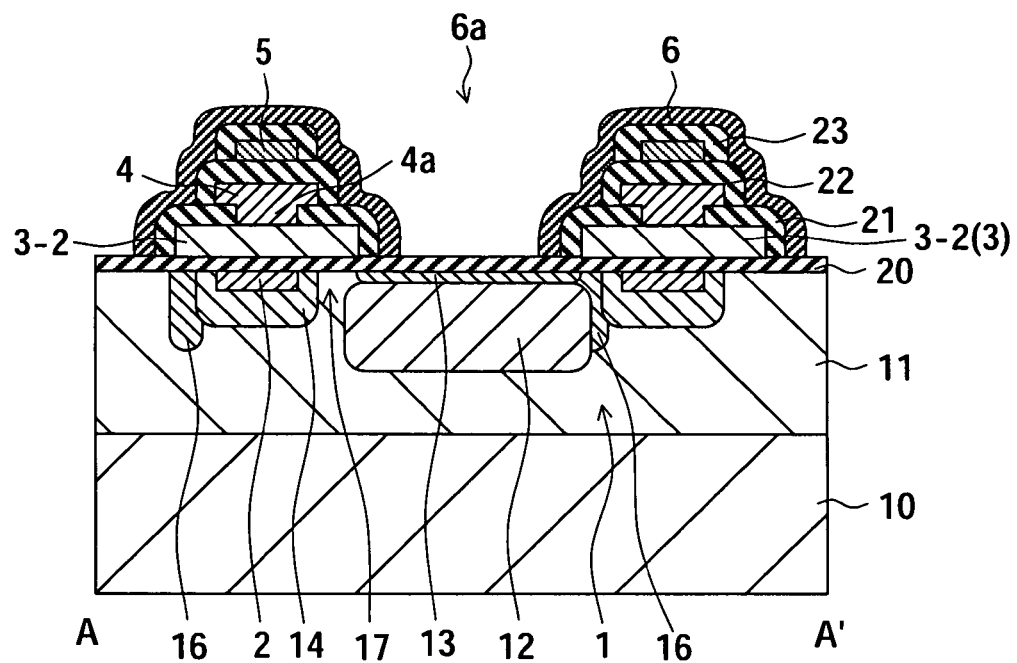
FIG. 2A is a cross-sectional view along line A-A' of FIG. 1, and FIG. 2B a cross-sectional view along line B-B' of FIG. 1.
Figure 2B:
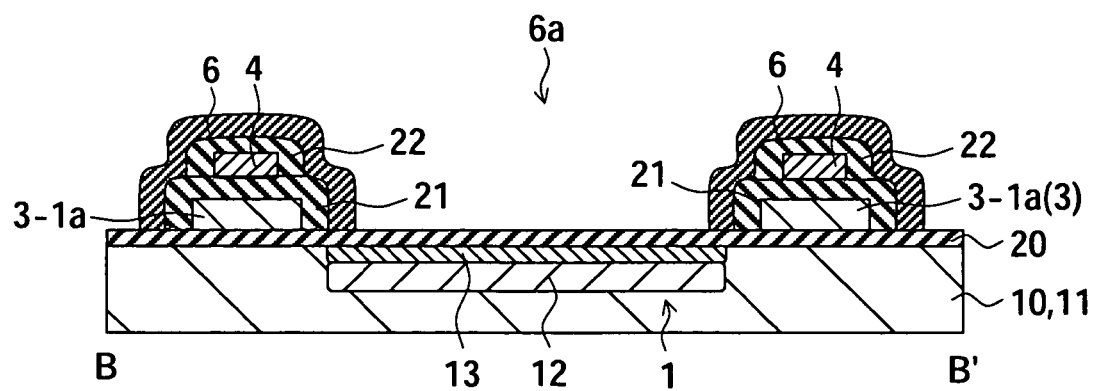

FIG. 2A is a cross-sectional view along line A-A' of FIG. 1, and FIG. 2B a cross-sectional view along line B-B' of FIG. 1.

In the present embodiment, for example, a semiconductor substrate 10 made of n-type silicon is used. In the semiconductor substrate 10, a p-type well 11 is formed. In the p-type well 11, an n-type region 12 is formed, and a p-type region 13 is formed at a surface side nearer than the n-type region 12. By a photo diode caused by a pn junction with the n-type region 12 and the p-type well 11, the light receiving portion 1 is formed. Since the p-type region 13 is formed at the surface side of the n-type region 12, a buried photo diode which makes the dark current reduce is formed.

A p-type well 14 is formed to adjoin the n-type region 12, and the transfer channel 2 made from an n-type region is formed in the p-type well 14. A p-type channel stop portion 16 for preventing a flow of the signal charge between the adjoining light receiving portions 1 is formed to adjoin the transfer channel 2. In an example in the drawing, a portion between the light receiving portion 1 and the transfer channel 2 which is a left side of the light receiving portion 1 becomes a readout gate portion 17. Therefore, a potential distribution is controlled by the transfer electrode 3 (more particularly, both of the second transfer electrode 3-2 and the third transfer electrode 3-3, or either of them), and the signal charge of the light receiving portion 1 is read out to the left side of the transfer channel 2.

On the semiconductor substrate 10 in which various semiconductor regions are formed, the transfer electrode 3 made of polysilicon (the second transfer electrode 3-2 in the drawing) and the inter-pixel interconnection 3-1a are formed via the gate insulation film 20.

An insulation film 21, for example, made of silicon oxide is formed so as to cover the transfer electrode 3 and the inter-pixel interconnection 3-1a. A shunt interconnection 4 made of polysilicon, tungsten, or other metal materials is formed via the insulation film 21 on the inter-pixel interconnection 3-1a. The shunt interconnection 4 is also formed on the second transfer electrode 3-2. An aperture is formed at the contact portion 4a in the insulation film 21, and the shunt interconnection 4 and the second transfer electrode 3-2 are connected at the contact portion 4a. Note that, when using tungsten or other metal materials as the shunt interconnection 4, the metal material formed with the shunt interconnection 4 and the second transfer electrode 3-2 are not connected directly at the contact portion 4a, a barrier metal is laid between the shunt interconnection 4 and the second transfer electrode 3-2.

An insulation film 22, for example, made of silicon oxide is formed so as to cover the shunt interconnection 4. The shunt interconnection 5 made of polysilicon, tungsten, or other metal material is formed via the insulation film 22 on the transfer electrode 3. It is omitted illustration in the drawing, an aperture is formed at a contact portion 5a (refer to FIG. 1) in the insulation film 22, and the shunt interconnection 5 and the third transfer electrode 3-3 are connected at the contact portion 5a. Note that, when using tungsten or other metal material as the shunt interconnection 5, the shunt interconnection 5 and the third transfer electrode 3-3 are not connected directly at the contact portion 5a, and a barrier metal may be laid between them.

An insulation film 23 made of silicon oxide is formed so as to cover the shunt interconnection 5. With laying the insulation films 21, 22, and 23, a shield film 6 is formed to cover the transfer electrode 3, the inter-pixel interconnection 3-1a, and the shunt interconnections 4 and 5. In the shield film 6, an aperture 6a is formed above the light receiving portion 1.

It is omitted illustration in the drawing, if necessary, a flatten film, a color filter, and an on-chip lens are formed as the upper layer of the light shield film 6.

Next, an operation of the solid-state imaging device according to the present embodiment will be described.

When incident light is irradiated to the light receiving portion 1, a signal charge (in the present embodiment, electron) is generated corresponding to the amount of the irradiated light by a photoelectric conversion, and stored for a specified duration in the n-type region 12 of the light receiving portion 1.

Passing through the shunt interconnections 4 and 5, the read out pulse ΦR is supplied to the second transfer electrode 3-2 and the third transfer electrode 3-3, then a potential distribution in the read out gate portion 17 is controlled, and the signal charge stored in the entire light receiving portion 1 is read out to the transfer channel 2. Note that, the read out pulse ΦR may be supplied to either the second transfer electrode 3-2 or the third transfer electrode 3-3.

The signal charge is read out to the transfer channel 2, and then three phases transfer pulses ΦV1 to ΦV3 are supplied through the inter-pixel interconnection 3-1a and the shunt interconnections 4 and 5 to the transfer electrodes 3-1, 3-2, and 3-3 which are arranged in the vertical direction. By the three phases transfer pulses ΦV1 to ΦV3, the potential distribution in the transfer channel 2 are controlled, and the signal charge is transferred in the vertical direction V.

It is omitted illustration in the drawing, the signal charge is transferred in the vertical direction V, then transferred in the horizontal direction H by the horizontal transfer unit, and sent to an output unit. In the output unit, the signal charge is converted to a voltage corresponding to an amount of the signal charge and output.

Note that, the solid-state imaging device having above configuration can be performed with the frame integration. In this case, the read out pulse ΦR may be supplied passing through the shunt interconnection 4 only to the second transfer electrode 3-2, and, for example, the read out pulse ΦR may be supplied to only an odd number of lines of the shunt interconnection 4 in a first field, and the read out pulse ΦR may be supplied to only an even number of lines of the shunt interconnection 4 in a second field.

Next, an effect of the solid-state imaging device according to the present embodiment will be descried.

In the solid-state imaging device according the present embodiment, the shunt interconnections 4 and 5 having narrower widths than a width W of the transfer electrode are formed in the horizontal direction H and in the vertical direction V as the upper layer of three types of the transfer electrodes 3-1, 3-2, and 3-3 with the single layer transfer electrode structure.

The shunt interconnection 4 placed in the horizontal direction H and for supplying the transfer pulse ΦV2 to the second transfer electrode 3-2 is formed on the inter-pixel interconnection 3-1a. Therefore, an interval between the light receiving portions 1 which are arranged in the vertical direction V may be secured for a single interconnection's worth, so a dimension of the light receiving portion 1 in the vertical direction V can be made large. Since a dimension in the vertical direction V can be made large, the eclipse of the incident light from the vertical direction V can be reduced, the eclipse is caused by the shield film 6 covering the inter-pixel interconnection 3-1a and the shunt interconnection 4.

The shunt interconnection 5 placed in the vertical direction V and for supplying the transfer pulse ΦV3 to the third transfer electrode 3-3 is formed on the transfer electrode 3, and a width thereof is narrower than the width W of the transfer electrode 3. Therefore, a sharply step difference is prevented from occurring in the periphery of the light receiving portion 1. As a result, the eclipse of the incident light from the horizontal direction H can be reduced due to the shield film 6 covering the transfer electrode 3 and the shunt interconnection 5.

As described above, the shunt interconnection is placed in the horizontal direction H between the pixels, and the shunt interconnection 5 is placed in the vertical direction V as the upper layer of the transfer electrode 3. So the eclipse of the incident light can be reduced and the light sensitivity of the light receiving portion 1 and a dynamic range can be made large.

The separated second transfer electrode 3-2 and third transfer electrode 3-3 are arranged to adjust the light receiving portion 1, so when supplying the read out pulse ΦR to both of the second transfer electrode 3-2 and the third transfer electrode 3-3, the read out width RW can be made large. As a result, a narrow channel effect (a phenomenon that the read out width RD is made large to increase a threshold) can be suppressed and a voltage of the read out pulse ΦR can be reduced.

In a portion between the pixels, the first transfer electrode 3-1 and the inter-pixel interconnection 3-1a are formed at the lower layer of the shunt interconnections 4 and 5. Therefore, even if the read out pulse ΦR is supplied to the shunt interconnections 4 and 5, by a shielding effect of the first transfer electrode 3-1 and the inter-pixel interconnection 3-1a, a potential of the semiconductor substrate 10 is not affected in the portion between the pixels. Therefore, the signal charge is prevented from flowing to the adjoining light receiving portion 1, namely, a color blend can be prevented.

Next, a method of producing the solid-state imaging device according to the present embodiment will be described with reference to process views of FIGS. 3A to 3H. A section in the process views of FIGS. 3A to 3H corresponds to a section of FIG. 2A.

Figure 3A:
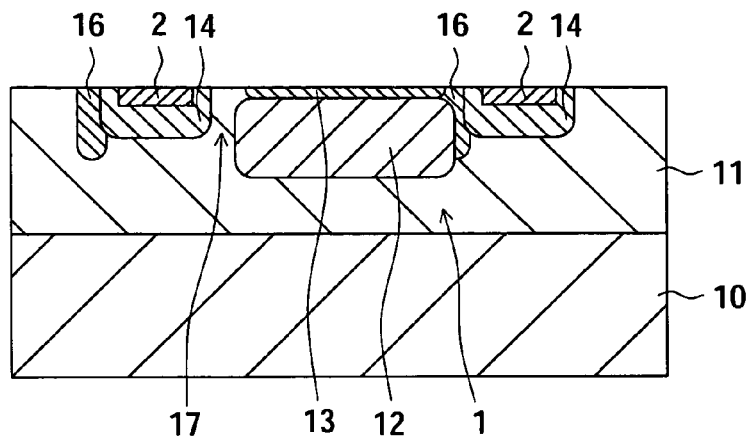
FIGS. 3A to 3H are cross-sectional views of a process for producing the solid-state imaging device according to the first embodiment.

As shown in FIG. 3A, various semiconductor regions are formed in the semiconductor substrate 10 by ion implantation, so the p-type well 11, the n-type region 12, the p-type region 13, the n-type transfer channel 2, the p-type well 14, and the channel stop portion 16 are formed. Note that, the p-type region 13 may be formed by the ion implantation after a formation of the transfer electrode. Here, the p-type region between the n-type region 12 and the transfer channel 2 which is left side in the drawing becomes the read out gate 17.

Figure 3B:
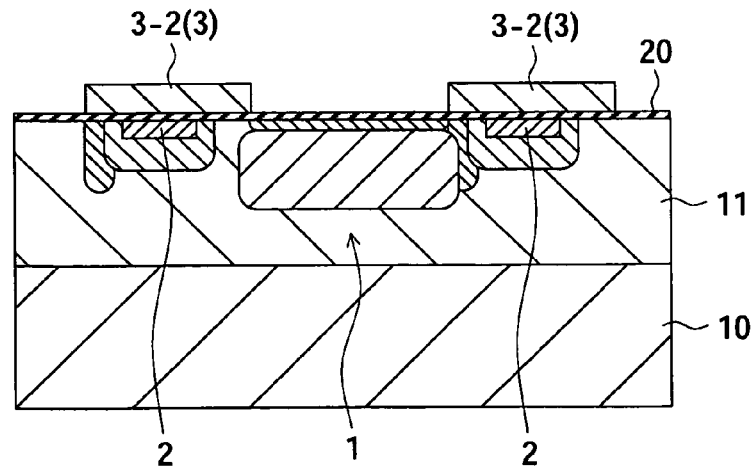

As shown in FIG. 3B, for example, the gate insulation film 20, for example, made of silicon oxide is formed by thermal oxidation on the surface of the semiconductor substrate 10. Then, polysilicon is deposited on the gate insulation film 20 by chemical vapor deposition (CVD), and processed by etching to form the transfer electrode 3 and the inter-pixel interconnection 3-1a (in the drawing, the second transfer electrode 3-2). The above polysilicon corresponds to an embodiment of the conductive layer according to the present invention.

Figure 3C:
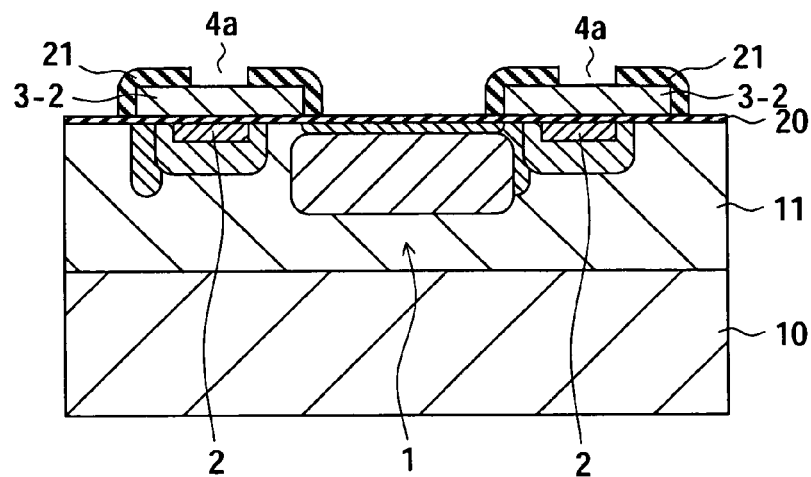

As shown in FIG. 3C, the insulation film 21, for example, made of silicon oxide is formed by the thermal oxidation to cover the transfer electrode 3. Then the insulation film 21 is removed at a position to be the contact portion 4a to expose a part of the second transfer electrode 3-2.

Figure 3D:
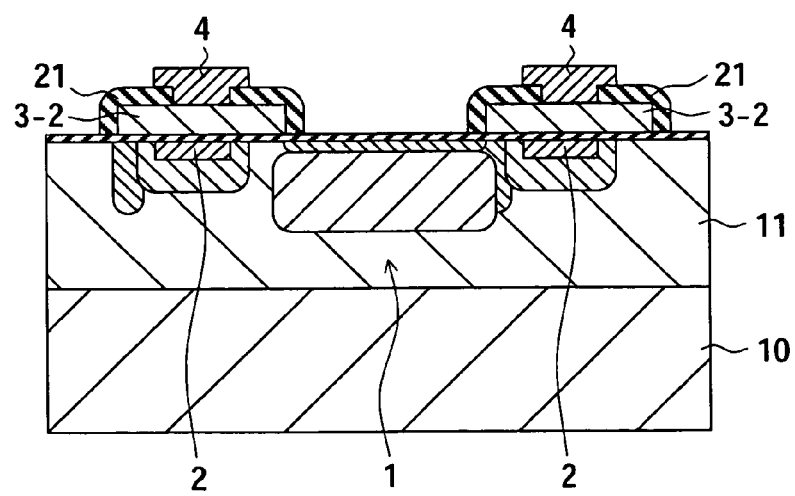

As shown in FIG. 3D, a polysilicon film is deposited on the insulation film 21 by CVD, and processed by dry etching to form the shunt interconnection 4. Note that, a titanium oxide or other barrier metal and tungsten or other metal layer may be deposited by a spattering method, and processed by dry etching to form the shunt interconnection 4. The shunt interconnection 4 is connected to the second transfer electrode 3-2 at the contact portion 4a.

Figure 3E:
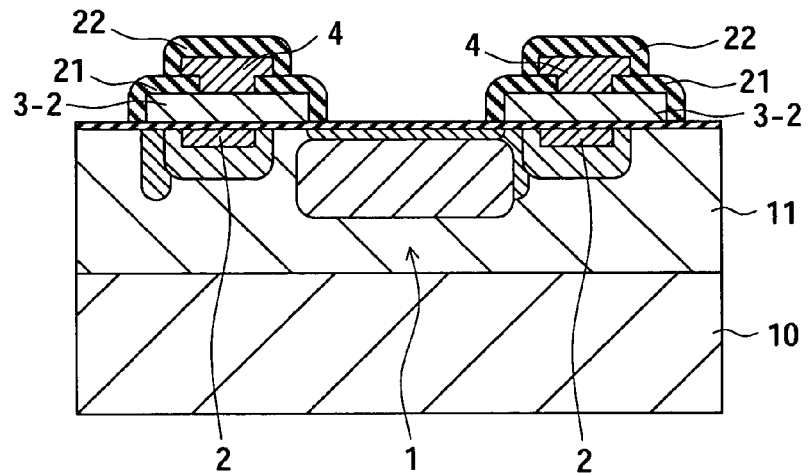

As shown in FIG. 3E, a silicon oxide film is deposited by the thermal oxidation or CVD to form the insulation film 22 to thereby cover the shunt interconnection 4. Then, the insulation film 22 is removed at a position to be the contact portion 5a (referred to FIG. 1) to expose a part of the third transfer electrode 3-3.

Figure 3F:
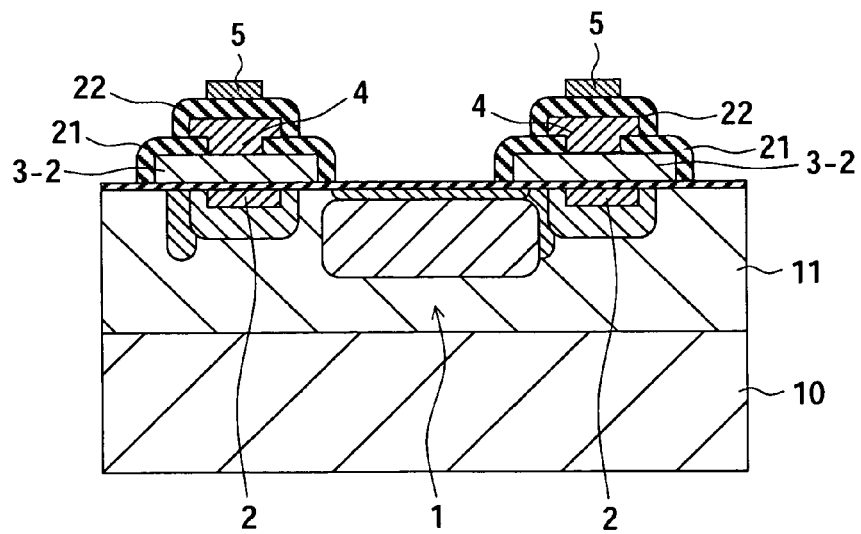

As shown in FIG. 3F, a polysilicon film may be deposited on the insulation film 22 by CVD, and processed by a dry etching to form the shunt interconnection 5. Note that, a titanium oxide or other barrier metal and tungsten or other metal layer are deposited by a spattering method, and processed by the dry etching to form the shunt interconnection 5. The shunt interconnection 5 is connected to the third transfer electrode 3-3 at the contact portion 5a.

Figure 3G:
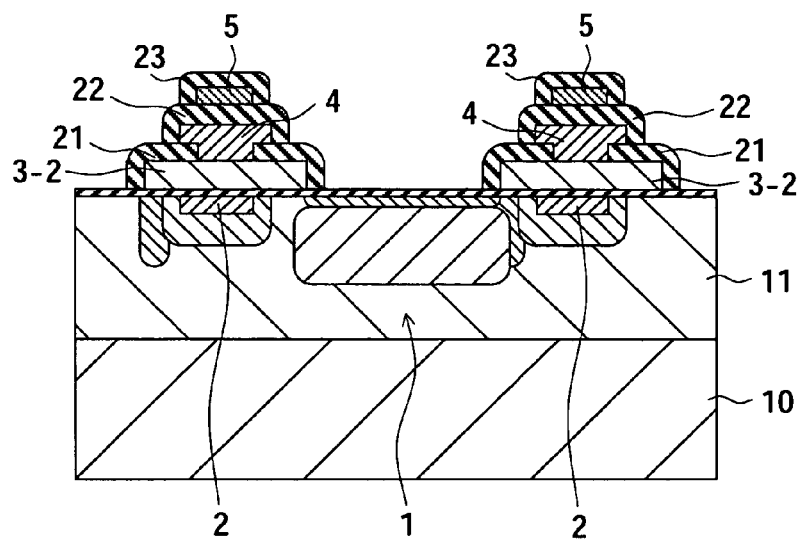

As shown in FIG. 3G, a silicon oxide film is deposited by the thermal oxidation or CVD to form the insulation film 23 covering the shunt interconnection 5.

Figure 3H:
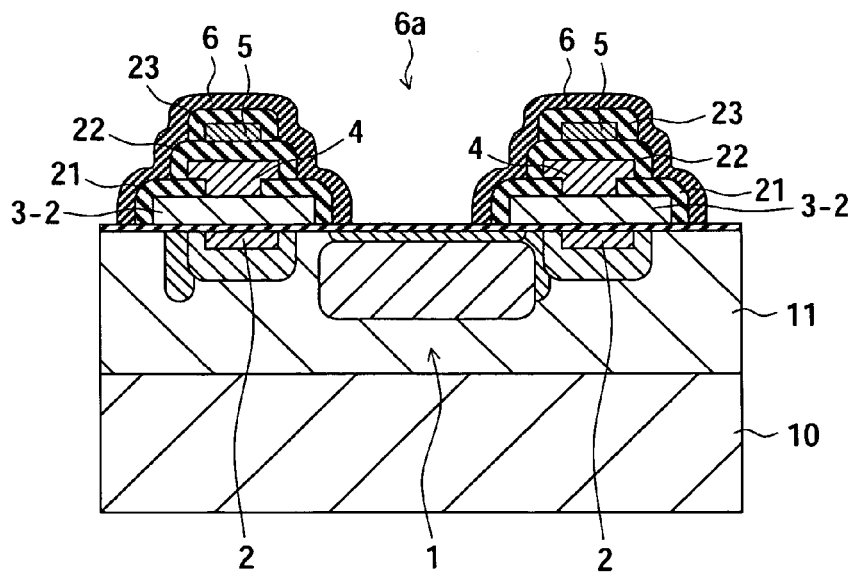

As shown in FIG. 3H, for example, a tungsten film is formed by the spattering or CVD, and processed by the dry etching to form the shield film 6 which covers the transfer electrode 3, the inter-pixel interconnection 3-1a, and the shunt interconnections 4, 5 and has an aperture 6a above the light receiving portion 1.

As the following steps, if necessary, a flatten film is formed above the shield film 6, a color filter is formed on the flatten film, and an on-chip lens is formed on the color filter, consequently the solid-state imaging device is produced.

The above solid-state imaging device can be used to, for example, a video camera, a digital steal camera, an electric endoscope camera or other camera.

Figure 4:
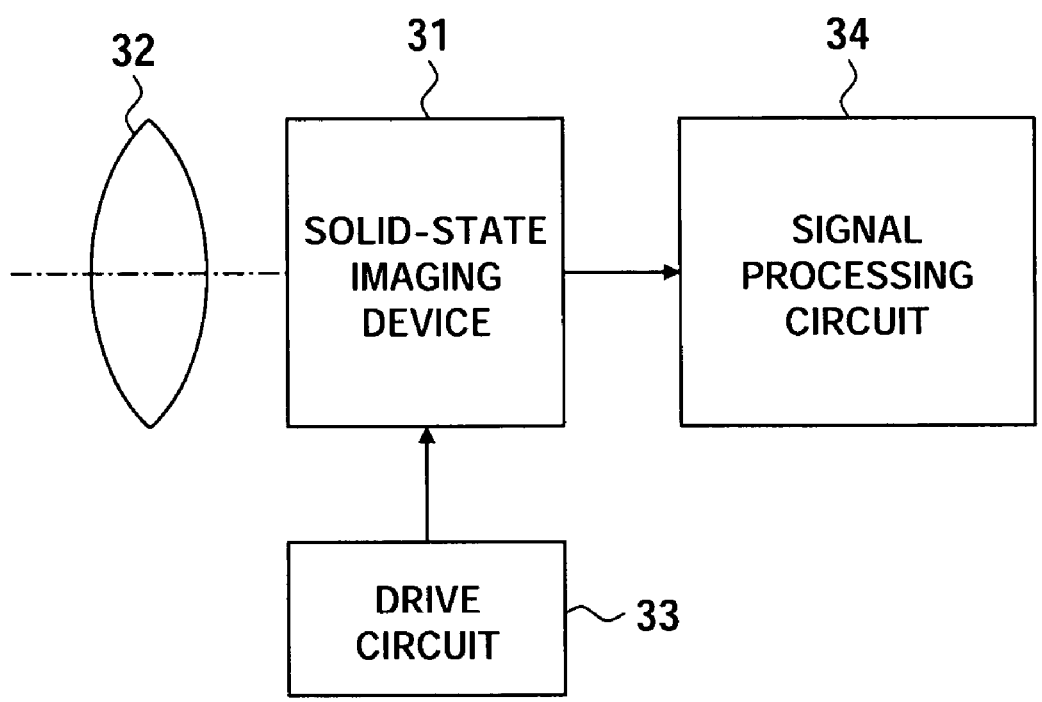
FIG. 4 is a view of a configuration of a camera applied with the solid-state imaging device according to the present embodiment.

FIG. 4 is a view of a configuration of a camera used with the above solid-state imaging device.

A camera 30 has the solid-state imaging device (CCD) 31, an optical system 32, a drive circuit 33, and a signal processing circuit 34.

The optical system 32 makes imaging light from a subject (incidence light) focus on an imaging surface of the solid-state imaging device 31. Consequently, in the respective light receiving portions 1 of the solid-state imaging device 31, the incidence light is converted to the signal charges corresponding to the amount of the incidence light. And in the light receiving portion 1, the signal charge is stored for a predetermined duration.

The drive circuit 33 supplies above three phases transfer pulse ΦV1, ΦV2, and ΦV3, the read out pulse ΦR, or various drive signals to the solid-state imaging device 31. Consequently, a read out, a vertical transfer, a horizontal transfer of the signal charge, or other various operation of the solid-state imaging device is performed. And by this operation, an analog imaging signal is output from an output unit of the solid-state imaging device 31.

The signal processing circuit 34 performs a noise elimination, a conversion to a digital signal, or various signal processing for the analog imaging signal output from the solid-state imaging device 31. After the signal processing by the signal processing circuit 34, the output signal is stored in a memory or other storage media.

In this way, by applying the solid-state imaging device described above to the camera 30 such as a video camera or a digital steal camera, it can be realized with the camera designing an improvement of the sensitivity and a dynamic range.

The present invention is not limited to the above embodiment.

The solid-state imaging device according to the present invention can be applied to an interline transfer system solid-state imaging device and a frame interline transfer system solid-state imaging device. A configuration upper than the light shield film 6 can be various modification.

It should be understood by those skilled in the art that various modifications, combinations, sub-combinations and alterations may occur depending on design requirements and other factors in so far as they are within scope of the appeared claims or the equivalents thereof.

What is claimed is:

1. A method of producing a solid-state imaging device comprising the steps of:
    injecting impurities to a substrate to form a plurality of light receiving portions and a plurality of transfer channels, said light receiving portion being arranged in a first direction and in a second direction perpendicular to said first direction, and said transfer channel being placed between the respective light receiving portions and extending in said second direction;
    depositing a conductive layer on said substrate;
    processing said conductive layer to form a first transfer electrode, a second transfer electrode, and a third transfer electrode which are repeatedly placed in the same plane on said respective transfer channels, and to form an inter-pixel interconnection which connects said plurality of said first electrode arranged in said first direction;
    forming a second transfer electrode drive interconnection above said first transfer electrode and said inter-pixel interconnection, said second transfer drive interconnection being connected to said plurality of said second transfer electrodes arranged in said first direction; and
    forming a third transfer electrode drive interconnection above said first, second, and third transfer electrodes, said third transfer drive interconnection being connected to said plurality of said third transfer electrodes arranged in said second direction.

2. A method of producing a solid-state imaging device as set forth in claim 1, wherein, in the step of processing said conductive layer, said second transfer electrode and said third transfer interconnection which are arranged to adjust said light receiving portion are formed.

3. A method of producing a solid-state imaging device as set forth in claim 1, after the step of forming said third transfer electrode drive interconnection, further comprising forming a shield film exposed with said respective light receiving portions.

4. A method of producing a solid-state imaging device as set forth in claim 1, wherein, in the step of forming said second electrode drive interconnection, polysilicon or metal material is patterned to form said second transfer electrode drive interconnection.

5. A method of producing a solid-state imaging device as set forth in claim 1, wherein, in the step of forming said third transfer electrode drive interconnection, polysilicon or metal material is patterned to form said third transfer electrode drive interconnection.

6. A method of producing a solid-state imaging device as set forth in claim 1, wherein, in the step of processing said conductive layer, said second transfer electrode with a separated shape in said first direction is formed.

7. A method of producing a solid-state imaging device as set forth in claim 1, wherein, in the step of processing said conductive layer, said third transfer electrode with a separated shape in said first direction is formed.

8. A method of producing a solid-state imaging device as set forth in claim 1, wherein, in the step of said second transfer electrode drive interconnection, said second electrode drive interconnection with a narrower width than said inter-pixel interconnection is formed.

9. A method of producing a solid-state imaging device as set forth in claim 1, wherein, in the step of said third transfer electrode drive interconnection, said third electrode drive interconnection with a narrower width than said first transfer electrode is formed.

* * * * *